United States Patent
Ebbecke et al.

(10) Patent No.: US 10,580,938 B2
(45) Date of Patent: Mar. 3, 2020

(54) LIGHT-EMITTING DIODE CHIP, AND METHOD FOR MANUFACTURING A LIGHT-EMITTING DIODE CHIP

(71) Applicant: OSRAM OLED GmbH, Regensburg (DE)

(72) Inventors: Jens Ebbecke, Rohr in Niederbayern (DE); Petrus Sundgren, Lappersdorf (DE); Roland Zeisel, Tegernheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/777,633

(22) PCT Filed: Nov. 17, 2016

(86) PCT No.: PCT/EP2016/078032
§ 371 (c)(1),
(2) Date: May 18, 2018

(87) PCT Pub. No.: WO2017/085200
PCT Pub. Date: May 26, 2017

(65) Prior Publication Data
US 2018/0374994 A1    Dec. 27, 2018

(30) Foreign Application Priority Data

Nov. 19, 2015   (DE) .................. 10 2015 120 089

(51) Int. Cl.
*H01L 33/44* (2010.01)
*H01L 33/30* (2010.01)
*H01L 33/00* (2010.01)

(52) U.S. Cl.
CPC .......... *H01L 33/44* (2013.01); *H01L 33/0062* (2013.01); *H01L 33/0095* (2013.01); *H01L 33/30* (2013.01); *H01L 2933/0025* (2013.01)

(58) Field of Classification Search
CPC ..... H01L 33/30; H01L 33/44; H01L 33/0062; H01L 33/0095
(Continued)

(56) References Cited

U.S. PATENT DOCUMENTS 7,943,942 B2    5/2011   Jiang et al.
2005/0233484 A1*  10/2005  Stein ................ H01L 33/44
                                           438/22
(Continued)

FOREIGN PATENT DOCUMENTS

CN    102017193 A    4/2011
CN    102544009 A    7/2012
(Continued)

OTHER PUBLICATIONS

Hoex, B. et al., "On the c-Si Surface Passivation Mechanism by the negative-charge-dielectric Al2O3," Journal of Applied Physics, vol. 104, 113703, Jan. 12, 2008, 7 pages.

*Primary Examiner* — Fazli Erdem
(74) *Attorney, Agent, or Firm* — Slater Matsil, LLP

(57) ABSTRACT

A light-emitting diode chip and a method for manufacturing a light-emitting diode chip are disclosed. In an embodiment a light-emitting diode chip includes an epitaxial semiconductor layer sequence having an active zone configured to generate electromagnetic radiation during operation and a passivation layer comprising statically fixed electrical charge carriers, wherein the passivation layer is located on a side surface of the semiconductor layer sequence covering at least the active zone.

10 Claims, 4 Drawing Sheets

(58) Field of Classification Search
USPC .......................................................... 257/103
See application file for complete search history.

(56) References Cited

U.S. PATENT DOCUMENTS

| | | | |
|---|---|---|---|
| 2006/0186418 A1 | 8/2006 | Edmond et al. | |
| 2007/0237479 A1* | 10/2007 | Seol | B82Y 20/00 385/129 |
| 2008/0113462 A1 | 5/2008 | Kim et al. | |
| 2008/0241421 A1* | 10/2008 | Chen | C23C 16/45525 427/576 |
| 2011/0241042 A1* | 10/2011 | Chen | H01L 33/08 257/94 |
| 2012/0267662 A1 | 10/2012 | Maute et al. | |
| 2013/0042907 A1* | 2/2013 | Ming-Nan | H01L 31/02168 136/255 |
| 2013/0105836 A1 | 5/2013 | Yokozeki et al. | |
| 2013/0105869 A1* | 5/2013 | Lee | H01L 29/42376 257/288 |
| 2013/0186460 A1* | 7/2013 | Chen | B82Y 20/00 136/256 |
| 2013/0291936 A1* | 11/2013 | Chen | H01L 31/02168 136/256 |
| 2015/0179876 A1* | 6/2015 | Hu | H01L 33/06 257/13 |
| 2016/0027972 A1* | 1/2016 | Taeger | H01L 33/44 257/100 |
| 2016/0197232 A1* | 7/2016 | Bour | H01L 33/20 257/13 |
| 2016/0307956 A1* | 10/2016 | Klipstein | H01L 31/02161 |
| 2016/0315218 A1* | 10/2016 | Bour | H01L 33/20 |
| 2017/0170360 A1* | 6/2017 | Bour | H01L 33/145 |
| 2018/0152002 A1* | 5/2018 | Ebbecke | H01S 5/0217 |
| 2018/0198087 A1* | 7/2018 | Rosenberger | H01L 51/448 |

FOREIGN PATENT DOCUMENTS

| | | |
|---|---|---|
| DE | 102009035429 A1 | 2/2011 |
| DE | 102015120323 A1 | 5/2017 |
| EP | 2423986 A2 | 2/2012 |
| GB | 2133928 A | 8/1984 |
| TW | 200841393 A | 10/2008 |
| WO | 2010020066 A | 2/2010 |
| WO | 2015044529 A1 | 4/2015 |

* cited by examiner

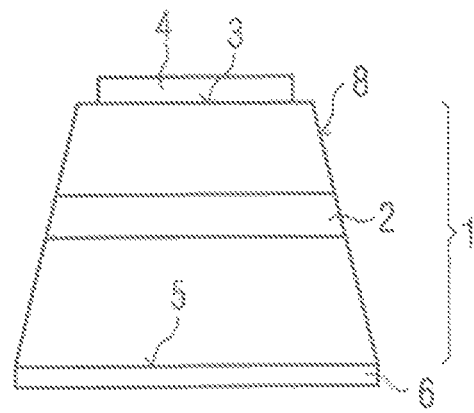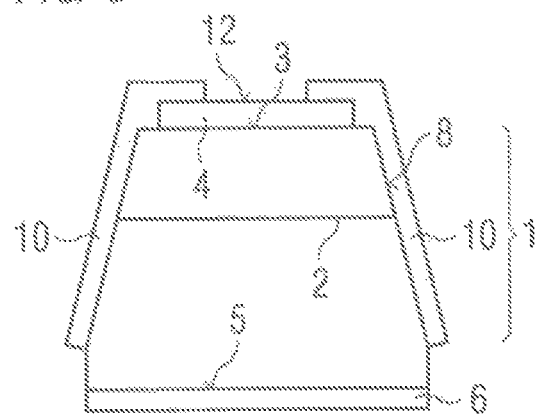

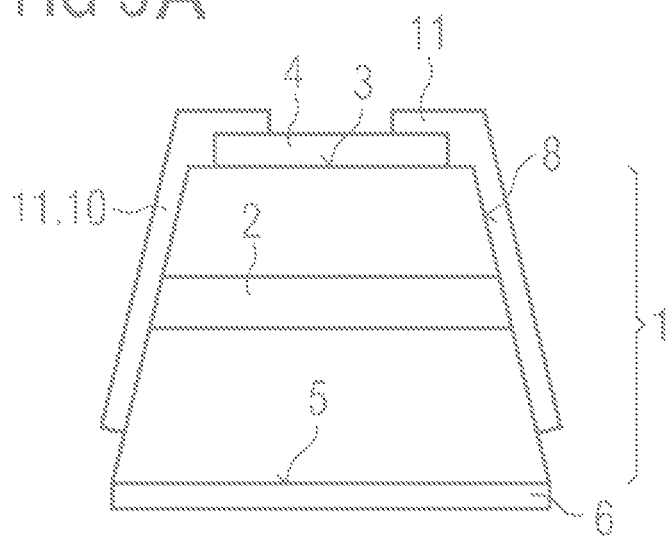
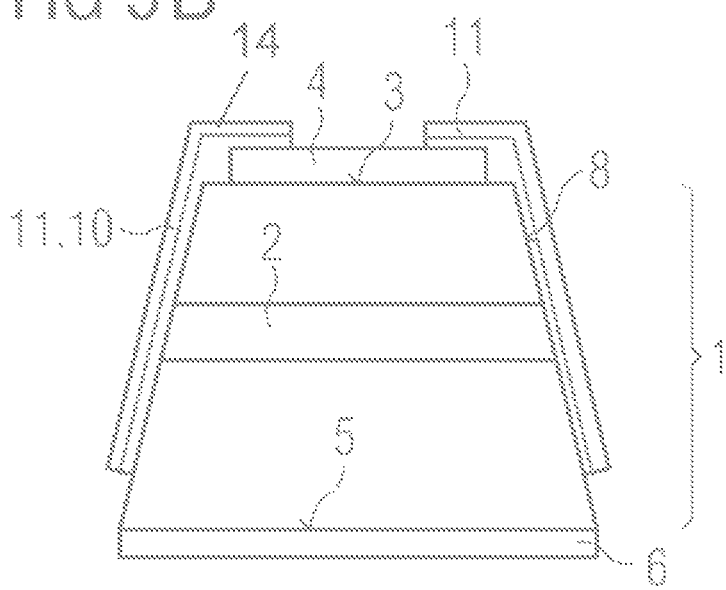

LIGHT-EMITTING DIODE CHIP, AND METHOD FOR MANUFACTURING A LIGHT-EMITTING DIODE CHIP

This patent application is a national phase filing under section 371 of PCT/EP2016/078032, filed Nov. 17, 2016, which claims the priority of German patent application 10 2015 120 089.9, filed Nov. 19, 2015, each of which is incorporated herein by reference in its entirety.

TECHNICAL FIELD

The invention relates to a light-emitting diode chip and to a method for producing a light-emitting diode chip.

BACKGROUND

German Publication No. DE 102 015 120 323 relates to a light-emitting diode chip having an encapsulation layer, which is arranged in places between a carrier and a reflective layer sequence, wherein the encapsulation layer extends in places through the reflective layer sequence into a semiconductor layer sequence. The disclosure content of the German Publication No. DE 102 015 120 323 is hereby incorporated by reference in its entirety.

Light-emitting diode chips, in particular on the basis of InGaAlP, often have an efficiency maximum at comparatively high current densities due to non-radiative losses in the active radiation-generating zone on etched side surfaces. This limits the use of such light-emitting diode chips at low current densities.

SUMMARY OF THE INVENTION

Embodiments of the application provide a light-emitting diode chip, the efficiency maximum of which lies at low current densities. Further embodiments provide a method for producing such a light-emitting diode chip.

According to one embodiment, the light-emitting diode chip has an epitaxial semiconductor layer sequence having an active zone, which generates electromagnetic radiation during operation.

In further embodiments, the light-emitting diode chip comprises a passivation layer, in which electrical charge carriers are statically fixed or which lead to a saturation of the surface states of the semiconductor layer sequence.

The passivation layer may be applied to a side surface of the semiconductor layer sequence and preferably laterally covers at least the active zone.

Furthermore, it is also possible for the passivation layer to extend over the entire surface of the side surface of the epitaxial semiconductor layer sequence. Alternatively or additionally, the passivation layer can also be arranged at least partially on a light exit surface of the epitaxial semiconductor layer sequence or of the light-emitting diode chip.

In various embodiments statically fixed carriers are arranged on the side surface of the semiconductor layer sequence, and in particular in the region of the active radiation-generating zone, so that charge carriers with opposite electric charge accumulate in the semiconductor material of the semiconductor layer sequence that adjoins the passivation layer. The statically fixed charges in the passivation layer advantageously lead to a shielding of the oppositely charged type of charge carriers on the side surface. Since both types of charge carriers have to be locally present for non-radiative effects, the non-radiative rate on the typically etched side surfaces, which leads to losses, is significantly reduced. The efficiency of the light-emitting diode chip is thus advantageously increased.

In further embodiments, the passivation layer is arranged in direct contact with the material of the epitaxial semiconductor layer sequence. In other words, the passivation layer has particularly preferably a common interface with the epitaxial semiconductor layer sequence.

According to an embodiment of the light-emitting diode chip, the statically fixed charge carriers are electrons.

In various embodiments, the statically fixed charges in the passivation layer achieve a bending of the band edge of conduction band and valence band in the semiconductor material of the epitaxial semiconductor layer sequence adjoining the passivation layer. In this manner, charge carriers from the semiconductor material accumulate in the semiconductor material adjoining the passivation layer, the charge of which is opposite to the charge of the statically fixed charge carriers in the passivation layer. Advantageously, the statically fixed charges in the passivation layer typically lead to a shielding of the oppositely charged type of charge carriers on the side surface.

For example, the statically fixed charge carriers in the passivation layer lead to a band edge bending in the region of the passivation layer to lower energies, so that here electrons accumulate in the boundary region of the semiconductor layer sequence. In contrast to the locally increased electron density in the passivation layer, positive charge carriers accumulate, for example, holes, in the adjoining region of the semiconductor layer sequence. The region of the band edge bending at the interface of the semiconductor layer sequence—passivation layer has, for example, an extent between 1 nanometer and 100 nanometers. For example, the band edge bending of the valence band edge and the conduction band edge is at least 0.1 eV.

According to one embodiment, the charge carrier density of the statically fixed charge carriers in the boundary region between the semiconductor layer sequence and the passivation layer has at least $10^{11}$ cm$^{-2}$. Particularly preferably, the charge carrier density of the statically fixed charge carriers in the boundary region between the semiconductor layer sequence and the passivation layer has at least $10^{12}$ cm$^{-2}$.

According to an embodiment, the epitaxial semiconductor layer sequence is based on a III/V semiconductor composite material.

The III/V semiconductor composite material may be a phosphide semiconductor composite material. A phosphide semiconductor composite material is a semiconductor composite material containing phosphorus, such as the materials from the system $In_xAl_yGa_{1-x-y}P$ with $0 \leq x \leq 1$, $0 \leq y \leq 1$ and $x+y \leq 1$. In particular, the epitaxially grown semiconductor layer sequence has one of these materials or consists of one of these materials.

The passivation layer may comprise a thickness of between 1 nanometer and 100 nanometers inclusive. Particularly preferably, the passivation layer is formed very thin. Preferably, the thickness of the passivation layer does not exceed 5 nanometers.

In various embodiments, the statically fixed charges in the passivation layer advantageously lead to a shielding of the oppositely charged type of charge carriers on the side surface. Since both types of charge carriers must be locally present for non-radiative effects, the non-radiative rate, which leads to losses, is significantly reduced at the side surfaces. In particular, this leads to an increase in efficiency in the case of light-emitting diode chips having a small lateral extent. Particularly preferably, the light-emitting diode chips therefore have an edge length which does not exceed 1 millimeter.

Furthermore, the increase in efficiency may be particularly effective in the case of a light-emitting diode chip, which has a comparatively high ratio of side surface to light exit surface. The ratio of the side surface to the light exit surface of the light-emitting diode chip is preferably at least 0.01.

The passivation layer preferably comprises one of the following materials or is formed from one of the following materials: aluminum oxide, silicon oxide, aluminum phosphide, indium aluminum phosphide.

According to a further embodiment of the light-emitting diode chip, the semiconductor layer sequence is based on a phosphide compound semiconductor material or is formed from a phosphide compound semiconductor material, wherein the passivation layer is applied in direct contact on the semiconductor layer sequence. In this case, the passivation layer preferably has aluminum phosphide and/or aluminum oxide. For example, it is possible for the passivation layer to be formed from two individual layers, of which one has an aluminum phosphide or consists of aluminum phosphide, while the other has aluminum oxide or consists of aluminum oxide. Particularly preferably, the aluminum oxide layer is arranged in direct contact with the semiconductor material.

Furthermore, it is also possible for the passivation layer to have disordered regions, of which the one have aluminum phosphide or consist of aluminum phosphide, while the other have aluminum oxide or consist of aluminum oxide. Particularly preferably, the passivation layer is formed very thin and has only a few nanometers. Furthermore, in this embodiment, the regions which have aluminum oxide preferably predominate the regions which have aluminum phosphide. For example, the passivation layer consists of at least 95% of aluminum oxide.

According to embodiment, in a method for producing a light-emitting diode chip, firstly an epitaxially grown semiconductor layer sequence having an active zone is provided, wherein the active zone is suitable for generating electromagnetic radiation.

A passivation layer, in which electric charge carriers are statically fixed, may be applied to a side surface of the semiconductor layer sequence. In this case, the passivation layer covers at least the active radiation-generating zone of the semiconductor layer sequence.

According to a further embodiment of the method, parts of the side surface of the semiconductor layer sequence are produced by etching, in particular by dry etching. This is also referred to as mesa etching. The side surface of the semiconductor layer sequence is typically initially partially produced by etching, while another part of the side surface is finally produced by another separating process, such as, for example, breaking, sawing or laser cutting. Particularly preferably, the active zone of the semiconductor layer sequence is separated by etching.

According to a yet another embodiment of the method, a semiconductor layer sequence is provided, which is based on a phosphide compound semiconductor material or consists of a phosphide compound semiconductor material. In order to apply the passivation layer, a non-stoichiometric silicon dioxide layer ($SiO_x$ layer) is applied to the side surface of the semiconductor layer sequence, preferably by thermal evaporation.

Then, an aluminum oxide layer ($Al_2O_3$ layer) may be applied in direct contact on the non-stoichiometric silicon dioxide layer, particularly preferably by means of an ALD method.

The atomic layer deposition (ALD) may be a special form of a CVD method.

In the case of a CVD method (chemical vapor deposition), the surface to be coated is provided in a volume. Furthermore, at least one starting material is provided in the volume, from which a solid CVD layer is deposited on the surface to be coated by a chemical reaction. Typically, at least a second starting material is provided in the volume, with which the first starting material reacts chemically to form the solid CVD layer on the surface. The CVD method is thus distinguished by at least one chemical reaction on the surface to be coated to form the CVD layer.

In the present case, the atomic layer deposition (ALD) may denote a CVD method, in which the first gaseous starting material is supplied to the volume, in which the surface to be coated is provided, so that the first gaseous starting material is adsorbed on the surface. After a preferably complete or almost complete coverage of the surface with the first starting material, the part of the first starting material, which is still gaseous or which is not adsorbed on the surface, is typically removed from the volume and the second starting material is supplied. The second starting material is formed to interact with the first starting compound, which is adsorbed on the surface, to form a solid ALD layer.

According to a further embodiment of the method, in order to apply the passivation layer, an aluminum phosphide layer (AlP layer) is initially applied to a semiconductor layer sequence based on a phosphide compound semiconductor material in direct contact with the side surface of the semiconductor layer sequence, for example, epitaxially.

According to a further embodiment of the method, the layer composite comprising the semiconductor layer sequence and the layers applied thereto is tempered. The temperature for tempering is preferably between 100° C. and 800° C. inclusive.

BRIEF DESCRIPTION OF THE DRAWINGS

Further advantageous embodiments and developments of the invention result from the exemplary embodiments described below in conjunction with the figures.

Based on the schematic sectional illustrations of FIGS. 1 to 3, a first exemplary embodiment of a method for producing a light-emitting diode chip is explained in more detail.

Based on the schematic sectional illustrations of FIGS. 4 and 5A-5B, a further exemplary embodiment of a method for producing a light-emitting diode chip is explained in more detail.

FIG. 6 shows a schematic sectional illustration of a light-emitting diode chip according to an exemplary embodiment.

Figure 7:
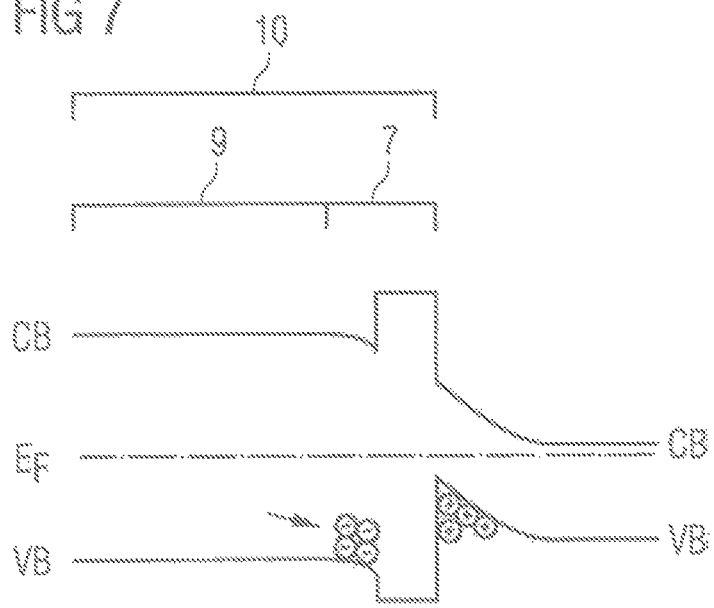

FIG. 7 shows schematically the conduction band and the valence band of the semiconductor material and of the passivation layer of the light-emitting diode chip according to one exemplary embodiment.

Figure 8:

FIG. 8 shows a schematic sectional illustration of a semiconductor sample, on the basis of which the positive effect of the passivation layer is experimentally confirmed.

Figure 9:
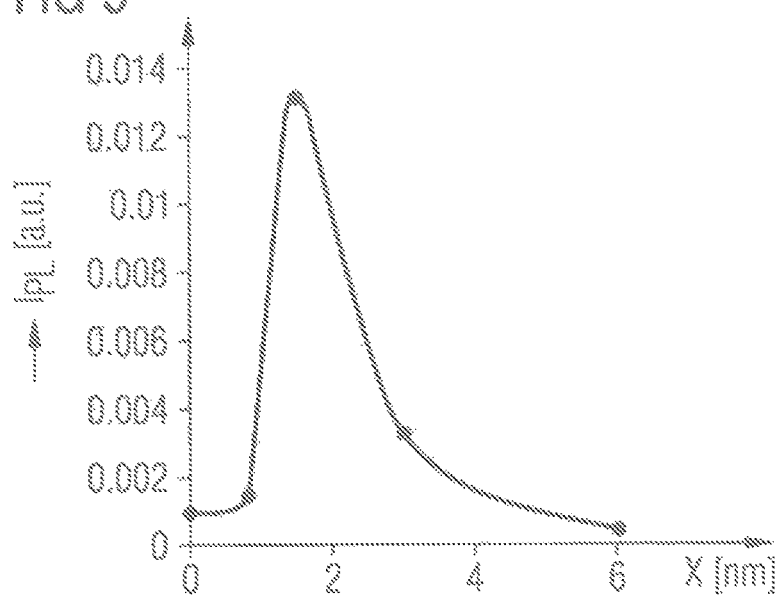

FIG. 9 shows measurements of the photoluminescence intensity of the sample with the structure according to FIG. 8 as a function of the thickness x of the aluminum phosphide layer.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1:
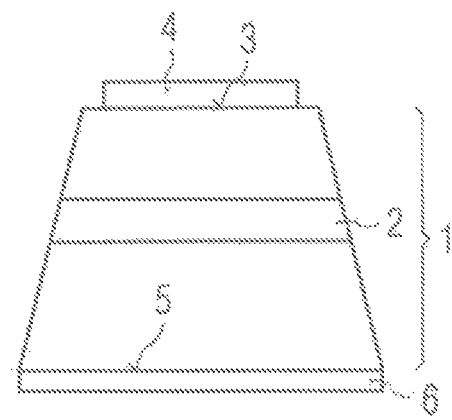
Figure 2:
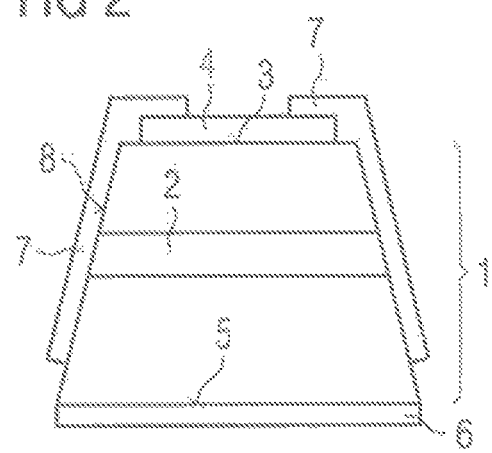
Figure 3:
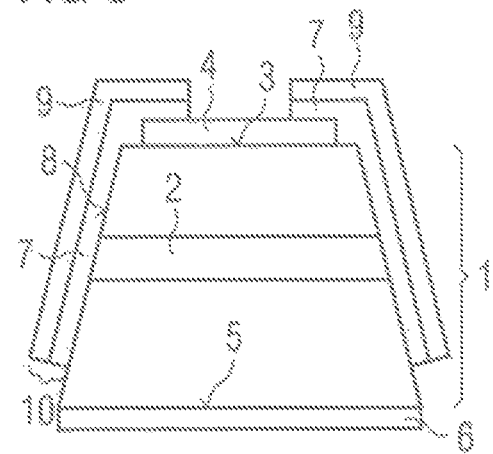

In the method according to the exemplary embodiment of the FIGS. 1 to 3, initially an epitaxially grown semiconductor layer sequence 1 having an active zone 2 is provided. In this case, the active zone 2 is suitable for generating electromagnetic radiation during operation of the light-emitting diode chip. The semiconductor layer sequence 1 is particularly preferably based on a phosphide compound semiconductor material.

In this case, a first electrical contact 4 is applied to a first main surface 3 of the epitaxially grown semiconductor layer sequence 1, while a second electrical contact 6 is applied to the second main surface 5 of the semiconductor layer sequence 1, which is opposite to the first main surface 3. For example, the first electrical contact 4 is a p-type contact and the second electrical contact 6 is an n-type contact.

In a next step, which is schematically represented in FIG. 2, a non-stoichiometric silicon oxide layer 7 ($SiO_x$ layer) is applied in direct contact on the side surface 8 of the semiconductor layer sequence 1 by means of thermal evaporation. In this case, the non-stoichiometric silicon dioxide layer 7 covers the active zone 2, in particular. Furthermore, the second main surface 5 of the semiconductor layer sequence 1 and the first electrical contact 4 are at least partially covered with the non-stoichiometric silicon oxide layer 7.

Subsequently, as schematically illustrated in FIG. 3, an aluminum oxide layer 9 ($Al_2O_3$ layer) is applied in direct contact on the non-stoichiometric silicon oxide layer 7, preferably by means of an ALD method.

Finally, the layer composite comprising the epitaxial semiconductor layer sequence 1 and the non-stoichiometric silicon oxide layer 7 applied thereto and the aluminum oxide layer 9 are tempered, so that an aluminum oxide-containing layer is formed at the interface to the semiconductor layer sequence 1. Said layer containing aluminum oxide within the passivation layer 10 has statically fixed charge carriers, preferably electrons.

In the present exemplary embodiment, the non-stoichiometric silicon oxide layer 7, the aluminum oxide layer 9 and the layer containing aluminum oxide close to the interface form the passivation layer 10.

In a first step of the method according to the exemplary embodiment of FIGS. 4 and 5A-5B, an epitaxial semiconductor layer sequence 1 is provide having electrical contacts 4, 6, as has already been described with reference to FIG. 1.

In a next step, an aluminum phosphide layer 11 (AlP layer) is applied in direct contact on the side face 8 of the semiconductor layer sequence 1, for example, epitaxially (FIG. 5). In this case, the aluminum phosphide layer 11 covers, in particular, the active zone 2 and extends as far as the first main surface 3 of the semiconductor layer sequence and the first contact 4.

The layer composite from FIG. 5A is also particularly preferably tempered in a next step (FIG. 5B). In this case, the aluminum phosphide is at least partially formed in aluminum oxide 14 ($Al_xO_y$).

In the present exemplary embodiment, the aluminum phosphide/oxide layer 11, 14 forms the passivation layer 10. The passivation layer 10 has fixed electrical charge carriers, preferably electrons, adjoining the semiconductor material of the semiconductor layer sequence 1.

In the method according to the exemplary embodiment of FIGS. 1 to 3 and 4 to 5, a light-emitting diode chip is produced, as is schematically illustrated in FIG. 6, for example.

The light-emitting diode chip according to the exemplary embodiment of FIG. 6 has an epitaxially grown semiconductor layer sequence 1 based on a phosphide compound semiconductor material. The semiconductor layer sequence 1 comprises an active zone 2, which is suitable to generate electromagnetic radiation, which is emitted by a light exit surface 12 during operation of the light-emitting diode chip.

A first electrical contact 4 is applied to a first main surface 3 of the epitaxially grown semiconductor layer sequence 1, while a second electrical 6 contact is applied to the second main surface 5 of the semiconductor layer sequence 1.

A passivation layer 10 is applied to the side surface 8 of the epitaxial semiconductor layer sequence 1 and to parts of the light exit surface 12 of the light-emitting diode chip. In particular, the passivation layer 10 extends over the active zone 2. In the passivation layer 10, electrical charge carriers are present, which are statically fixed. In the present case, the electric charge carriers are electrons. Furthermore, it is also possible for the passivation layer 10 to saturate surface states of the adjoining semiconductor material.

According to the exemplary embodiment of FIG. 6, parts of the side surface 8 of the semiconductor layer sequence 1 have been achieved by dry etching. These parts of the side surface 8 are characterized in the present case in that they are formed obliquely with respect to a central axis of the light-emitting diode chip. A further part of the side face 8 of the semiconductor layer sequence 1 is arranged in the present case parallel to a central axis of the light-emitting diode chip. This part of the light-emitting diode chip has been obtained by means of another separating process, for example, by means of sawing or laser cutting.

FIG. 7 schematically shows the profile of the conduction band edge CB and the valence band edge VB in the region of the passivation layer 10 and of the semiconductor layer sequence 1. In the present case, the passivation layer 10 comprises an aluminum oxide layer 9 and a non-stoichiometric silicon oxide layer 7. In the region of the interface of the passivation layer 10 adjacent to the semiconductor material, the valence band edge VB and the conduction band edge CB have a decrease towards lower energies in which electrons are statically fixed. In contrast, an increase in the valence band edge VB is formed on the side of the adjoining semiconductor material, in which holes are statically fixed. In this way, a shield for positive charges is produced at the interface of the semiconductor layer sequence 1—passivation layer 10, which at least reduces non-radiative recombination.

The sample according to the schematic representation of FIG. 8 has a gallium arsenide substrate 13, on which an InAlP layer having a thickness of approximately 1 micrometer is grown epitaxially. In turn, an approximately 300 nanometer thick InGaAlP semiconductor layer sequence 1 having an active zone 2, which emits the radiation with a wavelength of approximately 620 nanometers, is grown epitaxially on the InAlP layer.

An aluminum phosphide layer 11 having a very small thickness x is in turn applied to the epitaxially grown semiconductor layer sequence 1. It has been shown experimentally that the aluminum phosphide layer 11 exposed to air almost completely converts into an aluminum oxide layer ($Al_xO_y$ layer).

The thickness of the aluminum phosphide/oxide layer 11 x was now varied and the photoluminescence of the sample is measured. In FIG. 9, the values $I_{PL}$ of the photoluminescence measured on the sample according to FIG. 8 are plotted as a function of the thickness x. The measurement according to FIG. 9 shows that with a thickness x of approximately 2 nanometers the photoluminescence is increased by a factor of 10 compared to a sample without aluminum phosphide/oxide layer 11.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A light-emitting diode chip comprising:
    an epitaxial semiconductor layer sequence having an active zone configured to generate electromagnetic radiation during operation; and
    a passivation layer comprising statically fixed electrical charge carriers,
    wherein the passivation layer is located on a side surface of the semiconductor layer sequence covering at least the active zone,
    wherein the semiconductor layer sequence is based on a phosphide compound semiconductor material,
    wherein the passivation layer is arranged directly on the semiconductor layer sequence,
    wherein the passivation layer comprises an aluminum phosphide layer and an aluminum oxide layer, and
    wherein the passivation layer comprises at least 95% aluminum oxide.

2. The light-emitting diode chip according to claim 1, wherein the statically fixed charge carriers are electrons.

3. The light-emitting diode chip according to claim 1, wherein the statically fixed charge carriers of the passivation layer form a bending of a conduction band edge and a valence band edge in a semiconductor material of the epitaxial semiconductor layer sequence adjoining the passivation layer, so that charge carriers, whose charge is opposite to the charge of the statically fixed charge carriers, accumulate in the semiconductor material.

4. The light-emitting diode chip according to claim 1, wherein the epitaxial semiconductor layer sequence is based on a III/V semiconductor composite material.

5. The light-emitting diode chip according to claim 1, wherein the passivation layer has a thickness of between 1 nanometer and 100 nanometers inclusive.

6. The light-emitting diode chip according to claim 1, wherein the light-emitting diode chip has an edge length that does not exceed 1 millimeter.

7. The light-emitting diode chip according to claim 1, wherein the passivation layer comprises one of the following materials: aluminum oxide, silicon oxide, aluminum phosphide, or indium aluminum phosphide.

8. A method for producing a light-emitting diode chip, the method comprising:
    providing an epitaxially grown semiconductor layer sequence having an active zone, the active zone being suitable for producing electromagnetic radiation; and
    applying a passivation layer to a side surface of the semiconductor layer sequence so that electrical charge carriers are statically fixed in the passivation layer, wherein the passivation layer comprises at least 95% aluminum oxide
    wherein applying the passivation layer comprises:
        applying a non-stoichiometric silicon oxide layer directly on the side surface of the semiconductor layer sequence;
        applying an aluminum oxide layer directly on the silicon oxide layer forming a layer composite; and
        tempering the layer composite so that an aluminum oxide-containing layer is formed at an interface between the passivation layer and the semiconductor layer sequence.

9. The method according to claim 8, further comprising producing the side surface of the semiconductor layer sequence by etching.

10. The method according to claim 8, wherein the silicon oxide layer is deposited by thermal evaporation and the aluminum oxide layer is deposited by an ALD method.

* * * * *